United States Patent [19]

Nibby, Jr. et al.

[11] 4,296,467

[45] Oct. 20, 1981

[54] ROTATING CHIP SELECTION TECHNIQUE AND APPARATUS

[75] Inventors: Chester M. Nibby, Jr., Peabody; William Panepinto, Jr., Tewksbury, both of Mass.

[73] Assignee: Honeywell Information Systems Inc., Waltham, Mass.

[21] Appl. No.: 921,292

[22] Filed: Jul. 3, 1978

[51] Int. Cl.[3] .............................................. G11C 13/00
[52] U.S. Cl. ..................................... 364/200; 365/230
[58] Field of Search ... 364/200 MS File, 900 MS File; 365/230

[56] References Cited

U.S. PATENT DOCUMENTS

| | | | |
|---|---|---|---|
| 3,736,574 | 3/1973 | Gersbach | 365/189 |
| 3,872,452 | 3/1975 | Stoops | 365/230 |
| 3,898,631 | 8/1975 | Brown | 365/230 |
| 3,913,072 | 10/1975 | Catt | 364/900 |
| 3,949,378 | 4/1976 | Crabb | 364/200 |
| 3,972,025 | 7/1976 | Taddei | 364/200 |
| 4,001,786 | 1/1977 | Boehm | 364/200 |

OTHER PUBLICATIONS

Design of Digital Computers, Hans Gischwind, 1975 by Springer-Verlag, New York, pp. 233-239.

*Primary Examiner*—Gareth D. Shaw
*Assistant Examiner*—David Y. Eng
*Attorney, Agent, or Firm*—Faith F. Driscoll; Nicholas Prasinos

[57] ABSTRACT

A memory subsystem includes at least one up to a number of memory module boards identical in layout and construction. The board includes a number of memory chips which are positioned at an initial physical row location providing a predetermined number of addressable contiguous memory locations corresponding to a predetermined increment of memory capacity. The board further includes a register for receiving address signals for accessing the contents of a memory location, rotating chip selection circuits which include a set of switches and an arithmetic unit having first and second sets of input terminals. The first set of input terminals is connected to the register for receiving predetermined ones of the address signals representative of the physical row location of chips being addressed and the second set of input terminals are connected to receive signals from the set of switches. The arithmetic unit operates to perform a predetermined arithmetic operation upon the signals applied to the sets of input terminals to generate a set of logical row address signals for enabling the number of chips at the initial row location.

33 Claims, 6 Drawing Figures

| | | | | |
|---|---|---|---|---|
| INITIAL BOARD SIZE | 16KW | 32KW | 32KW | 64KW |
| FIRST UPGRADE | 16K | 32K | 16K | — |
| SECOND UPGRADE | 16K | — | 16K | — |
| FINAL UPGRADE | 16K | — | — | — |

Fig. 5b.

ROTATING CHIP SELECTION TECHNIQUE AND APPARATUS

BACKGROUND OF THE INVENTION

1. Field of Use

The present invention relates to memory systems and more particularly to apparatus and a method for simplifying the construction and expansion of such systems.

2. Prior Art

It is well known to construct memory systems utilizing a number of small memory modules. Normally, a small increment of memory is selected for the module size because it has the advantage of losing less memory space in the event of failure. For further discussion of such systems, reference may be made to U.S. Pat. No. 3,803,560 which is assigned to the same assignee as named herein.

In addition to the above, modular memory systems permit ready expansion of the users memory system capacity or memory space when desired. In order to accommodate such expansion, memory system manufacturers have been required to construct a number of different memory systems having different memory capacities or different size increments of memory. This, in turn, has necessitated the construction of a number of different types of memory units.

One prior art system disclosed in U.S. Pat. No. 4,001,790 assigned to the same assignee as named herein employs an arrangement which can utilize the same memory board construction for any one of a number of memory modules connected to a memory controller. In the arrangement, one type of memory board (mother board) includes the control logic circuits and another type memory board (daughter board) contains the memory module. It is required that the memory module board be capable of being plugged into any one of a number of different positions.

In this type of arrangement, it is possible to upgrade and expand the memory system utilizing the two types of memory boards mentioned above. Here, the memory increment or memory size corresponds to the capacity of the daughter board.

Due to certain system and/or packaging requirements, it becomes desirable to include both control logic circuits and memory module circuits on a single board. Because of the densities of memory module circuits available, it becomes necessary to provide memory sizes which are less than maximum memory capacity contained on the memory board.

However, each time a purchased memory system constructed with such single board type having less than the maximum memory capacity is desired to be increased or upgraded, the user is required to purchase an additional memory board type which includes the added capacity. Also, for proper maintenance, field personnel are required to have on hand, spares for each different memory board type.

Accordingly, it is a primary object of the present invention to provide a technique and apparatus for constructing a low cost modular memory system.

It is a further object of the present invention to provide a memory module low in cost to construct and which can be upgraded at low cost.

SUMMARY OF THE INVENTION

The above objects of the present invention are achieved in a preferred embodiment of a memory subsystem constructed in accordance with the technique and apparatus of the present invention. The memory subsystem includes from one up to a predetermined number of memory module boards identical in construction. Each board includes a number of memory chips which are designated permanently fixed or positioned at an area corresponding to an initial physical row location of a predetermined number of physical row locations. The row of chips provide a predetermined number of addressable multibit memory locations corresponding to a predetermined memory increment or memory address space.

Each board further includes a register for receiving address signals for accessing the contents of a memory location and rotating chip selection circuits which include a set of switches and an arithmetic unit having first and second sets of input terminals. The first set of input terminals connect to the register for receiving predetermined ones of the address signals representative of the physical row location of chips being addressed. The second set of input terminals connect to receive coded signals from the set of switches representative of the desired physical row location for the number of chips positioned at the initial physical row location.

The arithmetic unit operates to perform a predetermined arithmetic operation on the signals applied to the first and second sets of input terminals for generating a set of logical row address signals. These signals enable the operation of the chips positioned at the initial physical row location.

This permits the memory subsystem to be constructed from one board type and such subsystem to be upgraded by merely the addition of other memory boards of identical construction and identically populated (i.e., the number of chips in the same initial physical row).

For example, assume that a user has purchased a memory subsystem which includes a memory module board which has chips positioned at an initial physical row location, designated as row zero. The same user can upgrade or double his memory subsystem capacity by simply adding another such memory module board also having chips at row zero. By altering the set of switches to generate signals specifying the desired physical row location (i.e., row 1), the arithmetic unit causes the generation of a set of logical row address signals for enabling each of the chips positioned at the physical row location of the added board in response to address signals coded to address only memory locations within the added memory address space.

In the present embodiment, each such memory module board includes memory presence circuits which include a further set of switches and logic circuits. The memory presence circuits generate signals representative of the addressable memory address space being provided by a particular row of chips for application to the rotating chip select circuits. Therefore, in the above example, the second set of switches of the memory presence circuits for each memory module board is set to specify a different range of allowable addresses for allowing the rotating chip select circuits to enable the row of chips associated therewith.

It will be appreciated that a memory subsystem constructed with a memory module board populated with more than one row of chips but less than the predetermined number of rows can also be upgraded by the addition of the same or smaller memory module board in the manner described above.

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

DESCRIPTION OF THE PREFERRED EMBODIMENT

System and Memory Module Board

Figure 1:
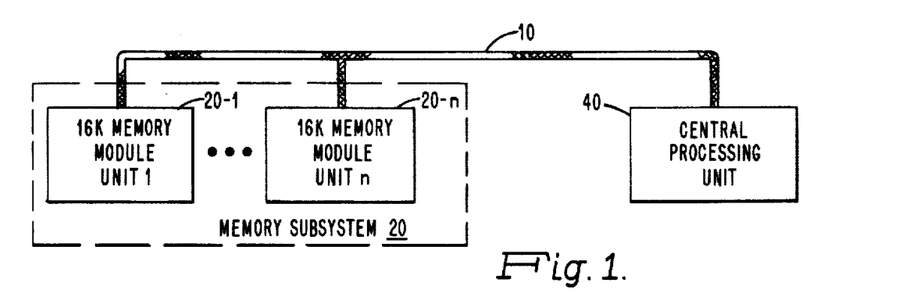
FIG. 1 shows in block diagram form a system which incorporates the method and apparatus of the present invention.

FIG. 1 shows in block diagram form, a data processing system which includes the apparatus of the present invention. As shown, the system includes a central processing unit (CPU) 40 which couples to a memory subsystem 20 through a common system bus 10. For the purpose of the present invention, the CPU 40 may be considered conventional in design.

The memory subsystem 20 includes up to n memory module boards 20-1 through 20-n. The memory subsystem 20 may include up to a total of 65,636 16-bit words of addressable memory space. In the system shown, each memory module board provides an increment of 16,384 16-bit words of memory space.

Figure 2:
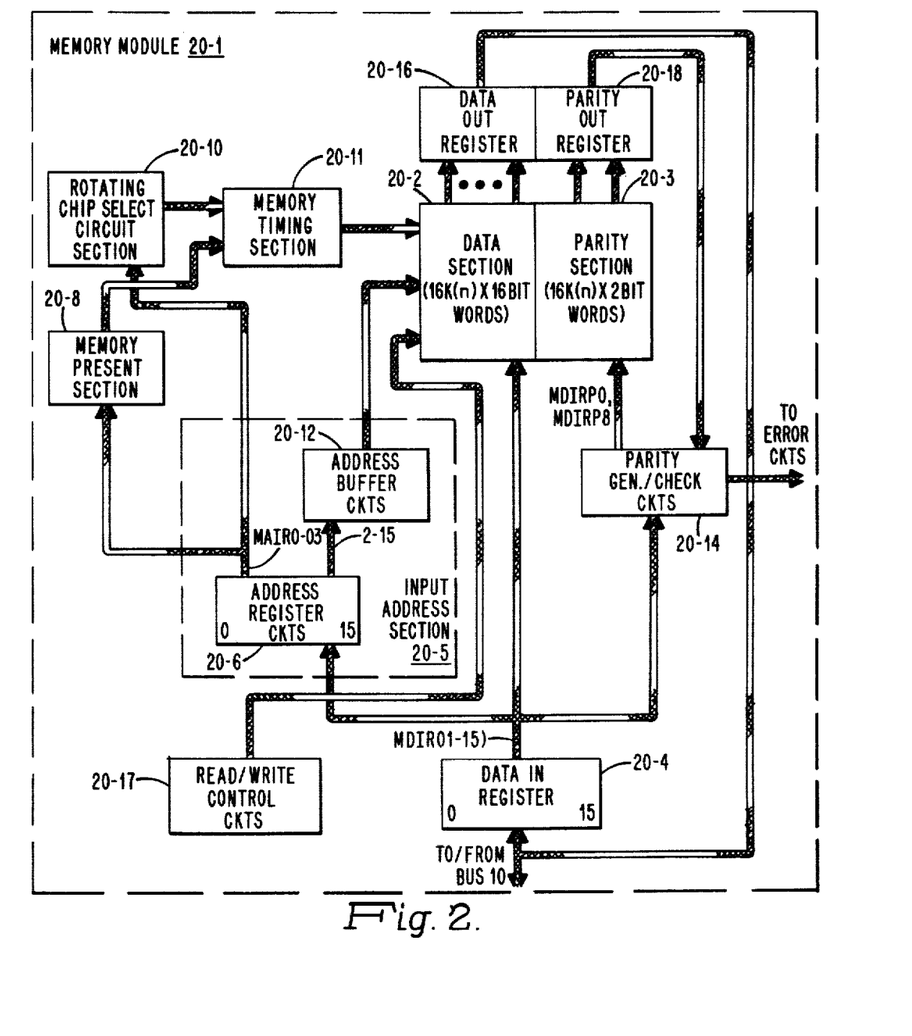
FIG. 2 shows in block diagram form the organization of a memory module board constructed in accordance with the principles of the present invention.

The organization of a memory module board, in accordance with the teachings of the present invention, is illustrated in FIG. 2. Referring to the Figure, it is seen that the memory module board 20-1 includes data section 20-2 and parity section 20-3. The sections include up to n rows of 16 K (1 K = 1,024) 1-bit memory chips organized to form words which include 16 data bits and two parity bits. These chips are conventional in design and may take the form of the 16,384 word by one bit dynamic random access memory designated as Intel's 2116 manufactured by Intel Corporation.

Input data and address signals applied from bus 10 are loaded into a 16-bit data IN register 20-4. The address signals are loaded into a 16-bit address register 20-6 of input address section 20-5. The high order four bits of the address signals stored in register 20-6 (i.e., signals MAIR0-03) are applied as an input to a memory present section 20-8 and to a rotating chip select circuit section 20-10. As explained herein, the rotating chip select section 20-10 operates to generate signals corresponding to a logical row address while memory present section 20-8 generates signals indicative of the range of addresses provided by the sections 20-2 and 20-3. These signals are applied as inputs to a memory timing section 20-11. Section 20-11 provides the various clocking signals required for activating the circuits of sections 20-2 and 20-3 synchronizing the operations within subsystem 20-1. As explained herein, section 20-11 generates one of a predetermined number of row chip select signals for enabling selection of the 16 K chips of a physical row location. The low order 14 address bits from register 20-6 are applied as an input to the address buffer circuits of block 20-12 which multiplexes the signals and applies them as inputs to sections 20-2 and 20-3.

Data signals loaded in register 20-4 are applied as inputs of data section 20-2 and to the parity generation/check circuits of block 20-14. The parity generation circuits of block 20-14, conventional in design, generate parity bit signals for each 8-bit byte of the data word which are written into the parity section 20-3 along with the data bits.

During read operation, data and parity bits of a word are read out into a data out register 20-16 and a parity out register 20-18. The parity bits are, in turn, applied to the parity generator/checker circuits 20-14. The results of the parity check are applied to error circuits, not shown. The data bits of the word are applied from data out register 20-16 to the bus 10.

The memory module board 20-1 further includes the read/write control circuits of block 20-17 which, for the purpose of the present invention, may be considered conventional in design. These circuits generate the write enable signals which are, in turn, applied to the 16 K RAM chips of sections 20-2 and 20-3.

Figure 4:
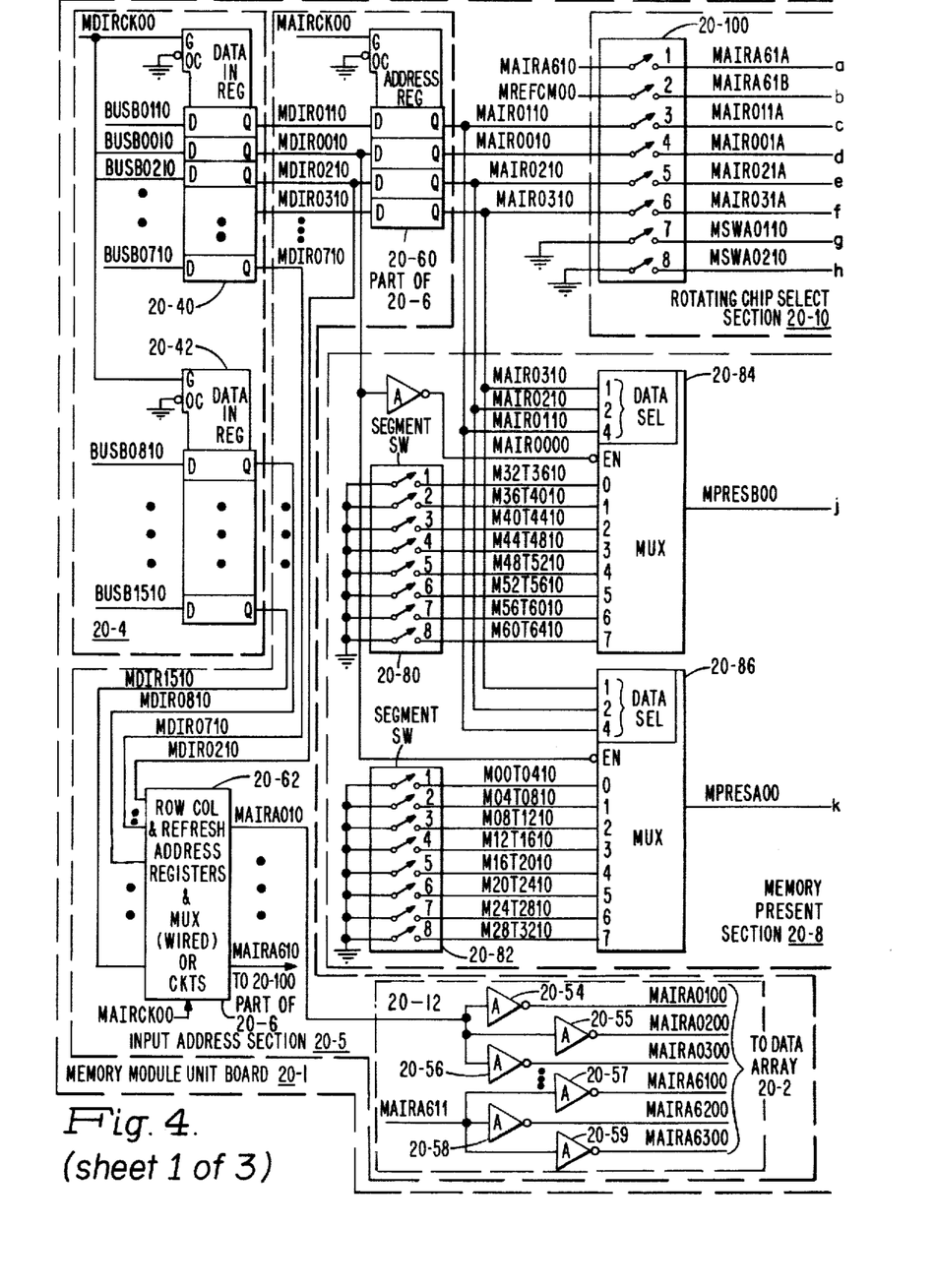
FIG. 4 shows in greater detail the organization of the memory module board of FIG. 2.

16 K Memory Module Board—FIG. 4

FIG. 4 shows in greater detail a portion of the circuits of FIG. 2. The board is populated with a single row of 16 K RAM chips for providing a 16 K increment of addressable memory space. As explained herein, in accordance with the teachings of the present invention, the RAM chips are permanently positioned at physical row location 0. Referring to the Figure, it is seen that the data in register 20-4 includes a pair of 8-bit registers 20-40 and 20-42. Each of the registers receive a data in register clock signal MDIRCK00 generated by memory timing section 20-11.

As seen from FIG. 4, the signals stored in the data registers 20-40 and 20-42 are applied as inputs to the address registers of blocks 20-60 and 20-62. The address register 20-60 receives signals corresponding to the upper four address bits coded to designate a 4 K segment of memory.

Figure 3:
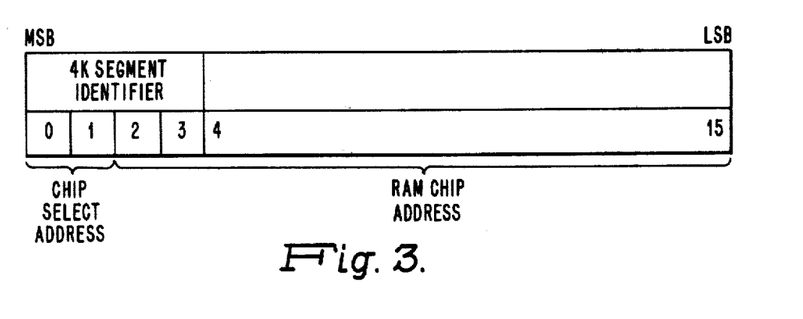
FIG. 3 illustrates the format of the address word used to access memory locations within the memory module board of FIG. 2.

The 16-bit address word is for addressing a 16 K RAM chip module has the format illustrated in FIG. 3. As seen from FIG. 3, bits 0-1 are coded to designate the address of the row of 16 K RAM chips. The remaining address bits 2-15 are coded to designate the address of a memory location within the row of 16 K RAM chips of sections 20-2 and 20-3.

It will be appreciated that block 20-62 includes a plurality of registers for storing row, column and refresh addresses. The register outputs are multiplexed by connecting them in a wired OR arrangement. The registers included therein as well as registers 20-40, 20-60 and 20-62, are conventional in design. Such registers may be constructed from D type transparent latches and edge triggered flip-flops with provision for being operated in a tri-state mode of operation. For example, the registers may be constructed from integrated circuit chips designated as SN74S373, manufactured by Texas Instruments Incorporated. Such tri-state mode of operation permits multiplexing of the three different sets of address signals by the circuits of block 20-62. Signals MDIRCK00 and MAIRCK00 are generated by timing circuits (not shown) within section 20-12 for loading or gating data and address signals into the registers 20-40, 20-42, 20-60 and 20-62.

The output address signals MAIRA010 through MAIRA610 are applied through sets of inverter circuits 20-54 through 20-59 to the input address terminals of the row of chips of data section 20-2. Inverter circuits are used to provide adequate driving capability for the maximum number of chips includable within sections 20-2 and 20-3.

The memory present section 20-8 includes a pair of eight position segment switches 20-80 and 20-82. These switches allow for selection of the range of addresses being provided by the chips within data array 20-2. The range is established in terms of increments of 4K of memory. The output terminal of each position of the segment switches 20-80 and 80-82 connect to a different one of the input terminals of the multiplexer circuits 20-84 and 20-86, as shown. The data select terminals of each of the multiplexer circuits 20-84 and 20-86 receive signals MAIR0110 through MAIR0310 from address register 20-50. The signal MDIR0010 and its complement MAIR0000 are applied to the enabling terminals of the multiplexer circuits 20-84 and 20-86 respectively.

A 4K increment of memory was chosen because the sections 20-2 and 20-3 may be also populated with RAM chips which have one-fourth the memory capacity (i.e., 4K RAM chips). Since both the 4K and 16K chips are pin compatible, each can use a common board design. Where only 16K RAM chips are utilized, the number of switch positions can be reduced to four.

The output terminals of the multiplexer circuits 20-84 and 20-86 are applied as inputs to a gate 20-88. The gate 20-88 forces the memory present signal MMPRES00 to a binary ZERO when the particular segment of memory or address range is being addressed as explained herein. The signal MMPRES00 is, in turn, applied to a NAND gate 20-89 which is operative to force memory present signal MMPRES10 to a binary ONE when the correct address range is addressed.

As seen from FIG. 4, the address signals stored in address register 20-60 are applied as inputs to certain positions of a function switch 20-100 of section 20-10. The first two positions of switch 20-100 provide for expansion of the number of address signals to be applied to the RAM chips of sections 20-2 and 20-3 (i.e., adds one additional address signal). The positions 3 through 6 of switch 20-100 receive the address register signals MAIR0010 to MAIR0310, as shown. The output terminals of switch positions 3 and 6 and positions 4 and 5 are wired together, as shown. The wired OR signals MAIR131C and MAIR021C are applied to the first two input terminals of the A operand input terminals of an adder circuit 20-102. This arrangement enables the selection of the upper pair (switch positions 3, 4) or lower pair (switch positions 5, 6) of segment address signals for sections including either 16K chips or 4K RAM chips. In the embodiment shown, positions 3 and 4 of switch 20-100 are closed.

Positions 7 and 8 of switch 20-100 are used so as to define the particular physical row location at which memory addressing is to start. The remaining bits of the A and B operand terminals are unused and therefore connect to the ground. It will be appreciated that memory sections having more than four rows of memory chips would utilize all of the sets of A and B operand input terminals.

The carry input terminal C0 of adder circuit 20-102 is connected to receive a binary ONE input signal via an inverter circuit 20-108. The adder circuit 20-102 performs the addition of up to two 4-bit binary words and generates the resulting sum at the sum output terminals S1-8 as indicated. It will be noted that the signals applied to the B operand input terminals are in 2's complement form. That is, the signals MSWA0110 and MSWA0210 are complemented by inverter circuits 20-104 and 20-106 and the binary ONE applied to the C0 input terminal is added to the signals applied to the A operand input terminals. The adder circuit 20-102 is conventional in design and may be constructed utilizing type SN74S283 chips manufactured by Texas Instruments Incorporated.

As also seen from FIG. 4, rotating chip select section 20-10 further includes a one of eight decoder circuit 20-110 for converting decoded output signals from adder circuit 20-102 into one of four row select signals MRCS00 through MRCS03. The row select signals generated by section 20-10 are applied as one input to a group of NAND gates 20-120 through 20-126 of section 20-12. The gates also receive a refresh command signal MREFCM00. The output signals MSROW010 through MSROW310 are, in turn, applied to another group of NAND gates 20-130 through 20-136 of section 20-12. Each of the AND gates 20-130 through 20-136 receive a memory present row address strobe signal MMPRAS10 generated by the gates circuits 20-138 through 20-142. The signal MMPRAS10 is forced to a binary ONE when the appropriate memory range is addressed (i.e., MMPRES10 is a binary ONE) and a row address strobe signal MTRASM10 is also a binary ONE. This signal is normally set to a binary ONE state during a read or write cycle of operation.

As seen from FIG. 4, the output signals MTRAS000 through MTRAS300 are applied as inputs to the chips of sections 20-2 and 20-3. As mentioned, the sections 20-2 and 20-3 can be populated to include up to 4 rows of 16K RAM chips. However, as mentioned, the section 20-2 is populated with 16 chips permanently mounted at physical location row 0. Thus, only output signal MTRAS000 is utilized.

Various combinations of address signals MAIRA010 through MAIRA610 are applied to the address input terminals of each of the 16 RAM chips. The scrambling of addresses enables the same memory board to be constructed with 4K RAM chips in lieu of 16K RAM chips, as mentioned previously. Each of the chips 20-20 through 20-35 is connected to receive the memory row selection or chip selection signal MTRAS000. When the signal MTRAS000 is a binary ZERO, this enables the address signals applied to the terminals of each RAM chip to be strobed or loaded into the row address register circuits internal of such chips. Each chip receives a different one of the data input signals MDIR0010 through MDIR1510 from data registers 20-40 and 20-42. The output signals MDOC00100 through MDOC15100 from each of the chips are applied to the data out register 20-16.

DESCRIPTION OF OPERATION

With reference to FIGS. 1 through 5b, the method and operation of the apparatus of the present invention will now be described. Referring first to FIG. 5a, there is illustrated diagrammatically, the number of different types of memory module boards constructed with and without the rotating chip select apparatus of the present invention. In the example illustrated, the memory module boards being constructed include a single row of RAM chips which provide a 16K increment of addressable memory space.

Figure 5A:
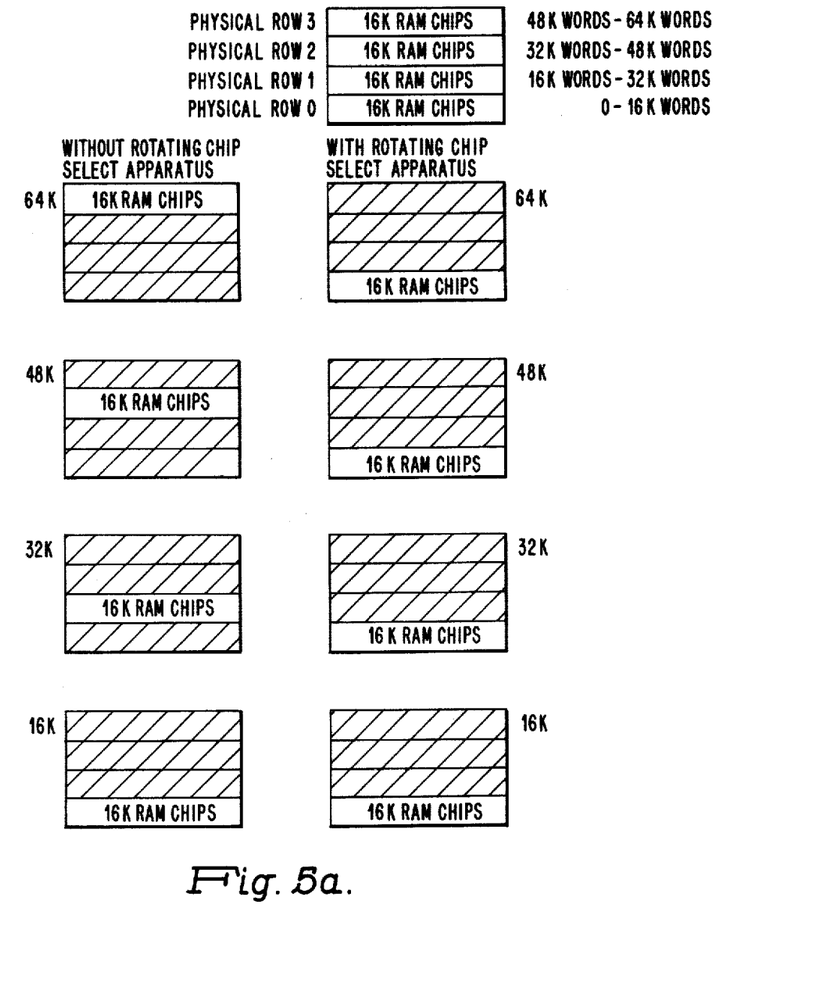
FIGS. 5a and 5b are used in illustrating the advantages of the method and apparatus of the present invention.

As seen from the Figure, a memory subsystem can have from 16K words of memory up to 64K words of memory. Each 16K increment is required to be positioned at a different physical row location. Therefore, each of the 16K RAM chips are required to be soldered into place at a specific physical row location.

It will be noted that memory subsystems which do not include rotating chips select apparatus require four different types of memory boards. That is, when a user purchases an initial 16K increment of memory, the first memory board has the 16K RAM chips positioned in physical row location 0 because the address signals applied to the board and decoded therein are required to be connected to that row. When the user wants to expand the memory subsystem to 32K, a second type of memory module board is added to the subsystem. The row of 16K RAM chips must be positioned at physical row location 1 because of the wiring and decoding of the address signals.

Similarly, when the user wishes to expand the memory subsystem to 48K or 64K, this again requires the addition of two more new types of memory module boards. The board which provides a 48K memory capacity has a row of 16K RAM chips positioned at physical row location 2 while the board which provides for the 64K capacity has a row of 16K RAM chips positioned at physical row location 3.

By contrast, the rotating chip select apparatus of the present invention eliminates the need for a manufacturer to construct four different board types. The arrangement, in fact, requires that only a single board type be constructed to provide for the same expansion provided in the first case. This board as discussed relative to FIG. 4 is constructed to have a row of 16K RAM chips positioned in physical row location 0.

In the case of the first 16K memory module board, positions 1-4 of segment switch 20-82 are open ("off"). All other positions of switches 20-80 and 20-82 are closed ("on"). This indicates that the address range for this memory module extends from 0 to 16K of addressable memory space. The function switch position 1 is closed to provide the additional address bit signal MAIRA611 required when sections 20-2 and 20-3 are populated with 16K RAM chips.

Positions 3 and 4 of the function switch 20-100 are also closed to permit the application of the high order two bits of the segment identifier bits of the incoming address word to be applied to the A operand input terminals of adder circuit 20-102. It will be appreciated that these address bits of the incoming address word are coded to specify which row of chips within sections 20-2 and 20-3 are being selected. Positions 7 and 8 of function switch 20-100 are placed in closed positions which results in a code of "00" being applied to the inverter circuits 20-104 and 20-106. This code specifies the physical row location at which addressing is to start.

In this particular example, the addressing starts at physical row location 0. However, the value "00" corresponding to the physical row location is subtracted from the row address signals of the address word applied from bus 10 to the memory subsystem 20. This is done by performing a 2's complement addition operation on the address signals applied to the B operand input terminals of adder 20-102.

Thus, a value of 0 is subtracted from the address signals applied to the A operand input terminals. Therefore, there is no modification or alteration of the row address signals by the adder circuit 20-102. The sum or result signals appearing at the sum output terminals of adder circuit 20-102 are applied to the select terminals of decoder circuit 20-110. When the appropriate segment has been addressed, the data select signals applied to multiplexer circuit 20-86 cause the selection of either position 0, 1, 2 or 3 which results in signal MPRESA00 being forced to a binary ONE state. At the same time, multiplexer circuit 20-84 has none of its positions selected which results in signal MPRESB00 remaining a binary ZERO.

The NAND gate 20-89 forces signal MMPRES10 to a binary ONE. This results in AND gate 20-142 allowing signal MMPRAS10 to be switched to a binary ONE. The decoder circuit 20-110 forces output signal MPCS0000 to a binary ZERO causing NAND gate 20-120 to force signal MSROW010 to a binary ONE. The result is that NAND gate 20-130 forces the row select signal MTRAS000 to a binary ZERO enabling the row of chips 20-20 through 20-35 for operation.

When the user desires to expand his memory subsystem to have a 32K capacity, another 16K memory module board identical in construction to the first board is added to the memory subsystem 20. Again, the row of 16K RAM chips are permanently positioned at physical location now 0.

Now, in the case of the second board, the various address bus and data connections are identical to those of the first board. However, positions 5-8 of segment switch 20-82 are opened ("off"). This establishes an address range of 16K through 32K of addressable memory space. Also, positions 7 and 8 of function switch 20-100 are set to a code of "01" indicating that addressing begins at physical row location 1. Accordingly, a value of "01" is subtracted from the incoming row address signals applied to the A operand input terminals of adder 20-102. The result is that the adder circuit 20-102 modifies the incoming address signals and generates a set of logical address signals which permit the selection of chips within physical row location 0. That is, the logical address signals appearing at the output sum terminals of adder circuit 20-102 cause the decoder circuit 20-110 to force row select signal MRCS000 to a binary ZERO.

To expand the capacity of memory subsystem 20 to 48K, another memory module board identical to the previous boards is added to the subsystem. That is, the memory board is connected to receive the same bus input signals and address and data signals. However, the segment switches 20-80 and 20-82, in addition to the function switch 20-100, are positioned as follows. Positions 1-4 of segment switch 20-80 are opened ("off"). Positions 7 and 8 of function switch 20-100 are set to a code of "10". That is, position 7 is placed in an open position while position 8 is placed in a closed position. This means that addressing is to commence with physical row location 2.

During operation, the incoming row address signals have a value of "10" subtracted therefrom by adder circuit 20-102. The result signals generated by adder circuit 20-102 appearing at the sum output terminals cause decoder circuit 20-110 to again force select signals MRC0000 to a binary ZERO.

Where the memory subsystem 20 is expanded to its maximum capacity of 64K, a fourth memory module board identical in construction to the first three is added to the subsystem 20. In this particular case, the positions 5-8 of segment switch 20-80 are "off" to specify an address range between 48 and 64K. The function switch 20-100 is set to apply a code of "11" to the inputs of inverter circuits 20-104 and 20-106. This means that addressing is to start with physical row location 3.

During operation, the adder circuit 20-102 modifies the row address signals applied to the A operand input terminals by the coded value indicative of the starting row location to produce a set of logical address signals which cause the selection of the chips positioned in physical row location 0. That is, the adder circuit 20-102 generates output signals for conditioning the decoder circuit 20-110 to force signal MRCS0000 to a binary ZERO.

From the above, it is seen that the rotating chip select apparatus, included within memory module boards of identical construction and type, operate to permit selection of the chips positioned at physical row location 0, notwithstanding the fact that the input address signals are coded to specify a different physical row location.

Figure 5B:
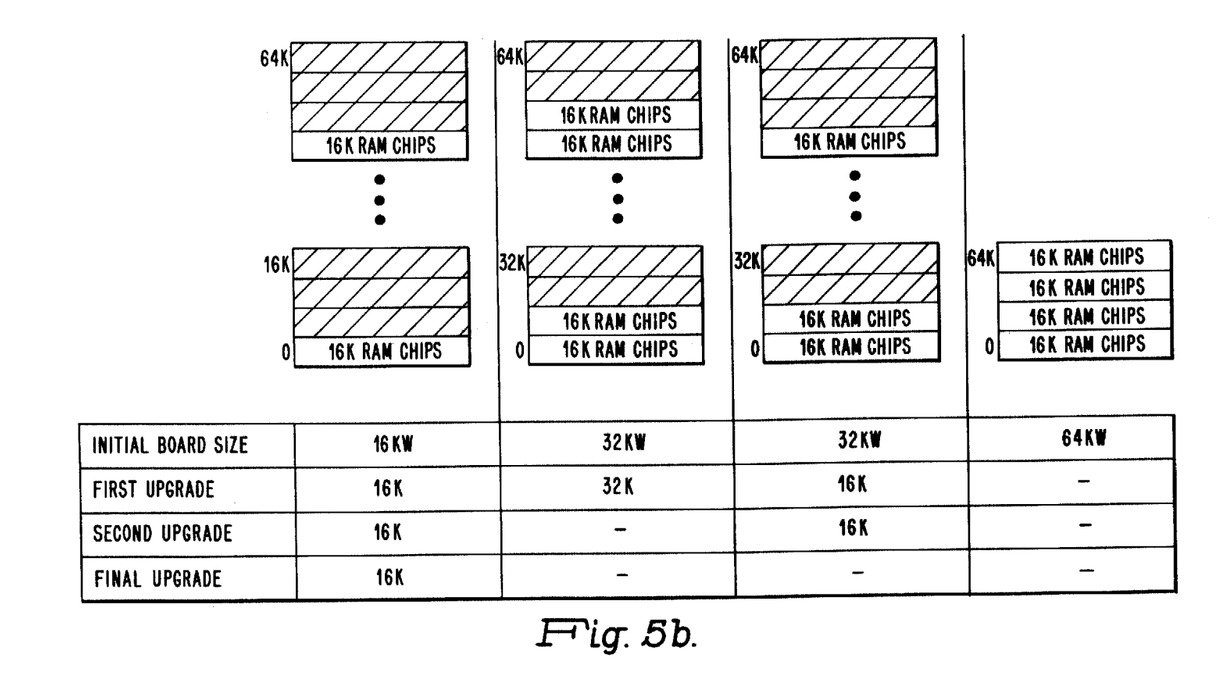

FIG. 5b illustrates the memory board types for different capacities of memory subsystem 20. It will be noted that these board types are constructed by populating the memory module board with one, two or four physical rows of chips in the manner shown in FIG. 5b. However, it will be noted that in those cases where expansion is possible (i.e., 16K and 32K memory capacities), expansion is provided through the use of the same board types.

It will be noted that the apparatus and method of the present invention permits memory subsystems to be constructed with a single type of memory module board. Further, with the exception of a memory module board which is fully populated, different types of memory module boards can be expanded utilizing a single board type. This arrangement allows the manufacturer of such memory subsystems to build one board type and retain, for maintenance purposes, one type of memory board.

It will be appreciated by those skilled in the art that the same arrangement may be utilized with other types of memory chips such as programmable read-only memory (PROM) chips, read-only memory chips, etc. It will be noted that this becomes desirable where such PROM chips are required to be permanently fixed at a particular physical row location. The term "permanently fixed", however, is not to be construed as being limited to a fixed mechanical connection but rather such term includes arrangements wherein the PROM or RAM chips are for all practical purposes permanently fixed within such physical row location.

Other changes may be made to the preferred embodiment such as applying the portion of the input address signals as a direct input to adder circuit 20-102 where it is desired to utilize only one type of RAM chip. Also, different circuit arrangements, for detecting addresses within a given range of addresses, may be used in combination with the apparatus of the present invention.

While in accordance with the provisions and statutes there has been illustrated and described the best form of the invention, certain other changes may be made without departing from the spirit of the invention as set forth in the appended claims and that in some cases, certain features of the invention may be used to advantage without a corresponding use of other features.

What is claim is:

1. At least one memory module board included in a memory subsystem, said board including a control section and a memory section having from one up to a predetermined number of physical row locations of memory chips, each row location of memory chips providing a like increment of addressable memory space, said memory section including:
   a number of addressable memory chips for providing a plurality of storage locations corresponding to said increment of memory space, said chips being positioned at a predetermined one of said row locations; and,
   said control section including:
   register means for receiving a portion of a plurality of address signals for accessing said storage locations within said increment of memory space, predetermined address bits of said portion of said address signals being coded to specify the physical row location of chips to be accessed;
   rotating selection switch means for selectively generating signals coded to specify a desired starting physical row location of said memory chips of said memory section; and,
   arithmetic means being coupled to receive said predetermined address bits of said portion and said coded signals from said rotating switch selection means, said arithmetic means being operative to generate logical row address signals by performing a predetermined arithmetic operation upon said predetermined address bits of said portion and said coded signals, said logical row address signals addressing said number of memory chips in said predetermined physical row location rather than a specified different physical row location when said increment of memory provided by said chips has been enabled by said portion for access.

2. The memory subsystem board of claim 1 wherein said predetermined row location corresponds to the physical row location position zero as designated by said coded signals designating said starting physical row location for said number of memory chips.

3. The memory subsystem board of claim 1 wherein said control section further includes decoder means being coupled to said number of memory chips included in said predetermined number of row locations and being coupled to said arithmetic means for receiving said logical row address signals, said decoder means being operative in response to said logical row address signals to generate signals for enabling the addressing of said number of addressable memory chips in said predetermined number of row locations when said predetermined address bits of said portion specifies a different physical row location.

4. The memory subsystem board of claim 3 wherein said rotating switch selection means includes a plurality of manually selectable switch positions, said positions being arranged for generating binary coded signals specifying said desired starting physical row location.

5. The memory subsystem board of claim 4 wherein said arithmetic means includes an adder circuit having first and second sets of input terminals and a set of output terminals, said first set of input terminals being connected to receive said predetermined address bits of said portion and said second set of input terminals being connected to receive said binary coded signals, said adder circuit being operative to perform said predetermined arithmetic operation upon said sets of signals resulting in the generation of said logical row address signals at said set of output terminals.

6. The memory subsystem board of claim 5 wherein said predetermined arithmetic operation corresponds to a subtraction operation.

7. The memory subsystem board of claim 5 wherein said control section further includes a plurality of inverter circuits, each coupled in series with a different one of said manually selectable switch positions and a corresponding one of said second set of input terminals, said plurality of inverter circuits applying signals which are the complement of said binary coded signals to said second set of input terminals and said adder circuit being conditioned to perform said subtraction operation by two's complement addition upon said sets of signals to generate said logical row address signals.

8. The memory subsystem board of claim 3 wherein each of said memory chips includes a row address strobe enabling input terminal and wherein said decoder means includes a decoder circuit having a plurality of input terminals connected to said set of output terminals of said adder circuit and a plurality of output terminals, a predetermined one of said output terminals being coupled to said row address strobe enabling input terminal of each of said number of memory chips of said predetermined row location for addressing said number of memory chips in response to said logical row address signals.

9. The memory subsystem board of claim 3 wherein said section further includes memory present circuit means comprising:

segment selection means for selectively generating output signals designating which increments of address space are being provided by said addressable memory chips included in said memory section;

selector means being connected to receive said output signals from said segment selection means and said portion of said memory address signals for specifying said increment of address spaced to be accessed, said selector means being conditioned by said portion of said memory address signals to generate signals for indicating whether said increment to be accessed is within said increments designated by said segment selection means; and, gating means coupled to said selector means and to said decoder means, said gating means logically combining said signals from said selector means and from said decoder means for said addressing of said memory chips of said predetermined row location only when said segment selector means generates an output signal indicating that said memory section includes said increment enabled for access by said portion.

10. The memory subsystem board of claim 9 wherein said segment selector means includes a number of manually selectable switch positions, each switch position for generating a different one of said output signals for designating a different increment within said addressable memory space and at least a predetermined one of said switch positions being placed in a predetermined state for generating said output signal.

11. The memory subsystem board of claim 10 wherein said selector means includes a plurality of data selection terminals, a plurality of input terminals corresponding, in number to said number of selectable switch positions and at least one output terminal, said plurality of data selection terminals being connected to receive signals corresponding to said portion, each of said plurality of input terminals being connected to a corresponding one of said number of said selectable switch positions and said output terminal being coupled to said gating means, said selector means in response to said portion signals to apply to said output terminal, said output signal from a selected one of said selectable switch positions for indicating whether said memory section includes said increment.

12. The memory subsystem board of claim 11 wherein said gating means includes a plurality of NAND circuits having a plurality of input terminals, one of said input terminals of each NAND circuit being coupled to receive said output signal from said selector means and another one of said input terminals being coupled to a different predetermined one of said output terminals of said decoder circuit.

13. The memory subsystem board according to claim 1 wherein said number of addressable memory chips of said memory section correspond to random access memory (RAM) chips permanently positioned in said predetermined row location.

14. The memory subsystem board according to claim 1 wherein said number of addressable memory chips correspond to programmable read only memory (PROM) chips permanently positioned in said predetermined row location.

15. The memory subsystem according to claim 9 wherein said subsystem is expanded to further include a second memory module board identical in construction to said one memory module board with said number of addressable memory chips permanently positioned only at said predetermined one of said row locations, and said rotating switch selection means of said one and said second memory module boards being arranged to generate binary coded signals having values of "00" and "01" respectively to provide a continuous address space made up of two like increments of memory chips using the same type of memory module board.

16. The memory subsystem of claim 15 wherein said segment selection means of said one and said second memory module boards are arranged to generate output signals designating first and second increments of said address space.

17. The memory subsystem of claim 16 wherein said subsystem is expanded to further include a third memory module board identical in construction to said one memory module board with said number of addressable memory chips permanently positioned only at said predetermined one of said row locations and said rotating switch selection means of said third memory module board being arranged to generate binary coded signals having a value of "10" to provide said continuous address space made up of three like increments of memory chips using said same type of memory module board.

18. The memory subsystem of claim 17 wherein said subsystem is expanded to further include a fourth memory module board identical in construction to said one memory module board with said number of addressable memory chips positioned only at said predetermined one of said row locations and said rotating switch selection means of said third memory module board being arranged to generate binary coded signals having a value of "11" to provide said continuous address space made up of four like increments of memory chips using said same type of memory module board.

19. The memory subsystem of claim 18 wherein said segment selection means of said third and fourth memory module boards are arranged to generate output signals designating third and fourth increments of said address space.

20. A memory module board for providing a predetermined increment of addressable memory space within a memory subsystem, said memory module board comprising:
   a number of addressable memory chips for providing a plurality of storage locations corresponding to said increment, said chips being permanently positioned at an initial row location on said board;
   register means for storing a selected portion of a memory address for accessing the contents of said plurality of storage locations, said selected portion including predetermined address bits coded to specify which row location of said chips are to be addressed;
   rotating switch selection means for selectively generating a set of binary coded signals specifying a desired starting row location for said memory chips on said board; and,
   arithmetic means being coupled to said register means and to said rotating switch selection means, said arithmetic means being operative to perform a predetermined arithmetic operation upon said predetermined address bits of said selected portion and said binary coded signals to produce a set of logical row address signals coded for addressing said number of memory chips in said initial row location rather than a specified different row location when said increment of memory has been enabled by said selected portion for access.

21. The memory module board of claim 20 wherein said initial row location corresponds to the row location position zero as designated by said binary coded signals designating said starting row location.

22. The memory board of claim 21 wherein said board further includes decoder means being selectively coupled to said number of memory chips and being coupled to said arithmetic means for receiving said set of logical row address signals, said decoder means being operative in response to said set of logical row address signals to generate signals for enabling the addressing of said number of addressable memory chips.

23. The memory board of claim 22 wherein said rotating switch selection means includes a plurality of manually selectable switch positions, said positions being arranged for generating said binary coded signals specifying said desired starting row location required for proper addressing of said increment.

24. The memory board of claim 23 wherein said arithmetic means includes an adder circuit having first and second sets of input terminals and a set of output terminals, said first set of input terminals being connected to receive said predetermined address bits of said portion and said second set of input terminals being connected to receive said binary coded signals, said adder circuit being operative to perform said predetermined arithmetic operation upon said sets of signals resulting in the generation of said set of logical row address signals at said set of output terminals.

25. The memory board of claim 24 wherein said predetermined arithmetic operation corresponds to a subtraction operation.

26. The memory board of claim 25 wherein said board further includes a plurality of inverter circuits, each coupled in series with a different one of said manually selectable switch positions and a corresponding one of said second set of input terminals, said plurality of inverter circuits applying signals which are the complement of said binary coded signals to said second set of input terminals and
   said adder circuit being conditioned to perform said subtraction operation by two's complement addition upon said sets of signals to generate said logical row address signals.

27. The memory board of claim 22 wherein each of said memory chips includes a row address strobe enabling input terminal and wherein said decoder means includes a decoder circuit having a plurality of input terminals connected to said set of output terminals of said adder circuit and a plurality of output terminals, a predetermined one of said output terminals being coupled to said row address strobe enabling input terminal of each of said number of memory chips of said initial row location for said number of memory chips in response to said set of logical row address signals.

28. The memory board of claim 22 wherein said board further includes memory present circuit means comprising:
   segment selection means for selectively generating output signals designating which increments of address space are being provided by said addressable memory chips included in said board;
   selector means being connected to receive said output signals from said segment selection means and said portion of said memory address signals for specifying said increment of address space to be accessed, said selector means being conditioned by said selected portion of said memory address signals to generate signals for indicating whether said increment to be accessed is within said increment designated by said segment selection means; and,
   gating means coupled to said selector means and to said decoder means, said gating means logically combining said signals from said selector means and from said decoder means for enabling said addressing of said memory chips of said initial row location only when said segment selector means generates an output signal indicating that said board includes said increment enabled for access by said portion.

29. The memory board of claim 28 wherein said segment selector means includes a number of manually selectable switch positions, each switch position for generating a different one of said output signals for designating a different increment within said addressable memory space and at least a predetermined one of said switch positions being placed in a predetermined state for generating said output signal.

30. The memory board of claim 29 wherein said selector means includes a plurality of data selection terminals, a plurality of input terminals corresponding in number to said number of selectable switch positions and at least one output terminal, said plurality of data selection terminals being connected to receive signals corresponding to said portion, each of said plurality of input terminals being connected to a corresponding one of said number of said selectable switch positions and said output terminal being coupled to said gating means, said selector means in response to said selected portion to apply to said output terminal, said output signal from a selected one of said selectable switch positions for indicating whether said board includes said increment.

31. A method of constructing a low cost memory subsystem whose capacity is readily expanded from one up to a plurality of memory module boards requiring use of a minimum number of different board types, said method comprising the steps of:

constructing a first memory module board to include a memory section and control section;

mounting permanently in said memory section, a number of addressable memory chips positioned at an initial row location on said board for providing a plurality of storage locations corresponding to an increment of memory;

constructing said control section to include a register, a plurality of rotatable selection switches, an arithmetic unit and a decoder circuit;

connecting said register to receive for storage a selected portion of a memory address required for accessing the contents of said storage locations;

setting said plurality of rotatable selection switches to generate binary coded signals which specify a desired starting physical row location for said memory chips on said board;

connecting said arithmetic unit to perform a predetermined arithmetic operation upon predetermined addressed bits of said selected portion of said memory address and said binary coded signals to provide a set of logical row address signals; and connecting said decoder circuit for decoding said set of logical row address signals to address said memory chips positioned at said initial row location when said predetermined address bits of said selected portion specifies a different row location and said increment has been enabled by said portion for access.

32. The method of claim 31 wherein for an initial increment, said plurality of rotatable selection switches are set to generate binary coded signals having the value "00".

33. The method of claim 32 wherein said method further includes the steps of:

adding a second memory module board to said memory subsystem which is identical in construction to said first module board and connected to receive said selected portion of the memory address signals;

setting said plurality of rotatable selection switches to generate binary coded signals which specify a next desired starting physical row location for said chips on said board; and causing said decoder circuit to address said memory chips at said initial row location when said predetermined address bits of said selected portion specifies a different row location for addressing a second increment of memory enabled for access by said portion.

* * * * *